United States Patent
Norberg et al.

(10) Patent No.: US 12,191,620 B2
(45) Date of Patent: Jan. 7, 2025

(54) TERMINAL BLOCK UNIT FOR AN INPUT/OUTPUT DEVICE OF A MODULAR PROCESS CONTROL SYSTEM

(71) Applicant: ABB Schweiz AG, Baden (CH)

(72) Inventors: Robert Norberg, Eskilstuna (SE); Bernd Wansner, Minden (DE); Thomas Keul, Freigericht (DE); Stefan Pook, Minden (DE); Ulf Hansson, Västerås (SE); Joerg Schubert, Lehrte (DE); Jorgen Aslund, Västerås (SE)

(73) Assignee: ABB Schweiz AG, Baden (CH)

( * ) Notice: Subject to any disclaimer, the term of this patent is extended or adjusted under 35 U.S.C. 154(b) by 372 days.

(21) Appl. No.: 17/851,686

(22) Filed: Jun. 28, 2022

(65) Prior Publication Data
US 2022/0416452 A1    Dec. 29, 2022

(30) Foreign Application Priority Data

Jun. 29, 2021   (EP) .................................... 21182384

(51) Int. Cl.
*H01R 9/24*     (2006.01)
*H01R 13/514*   (2006.01)
*H05K 7/14*     (2006.01)

(52) U.S. Cl.
CPC ............ *H01R 9/24* (2013.01); *H01R 13/514* (2013.01); *H05K 7/1469* (2013.01)

(58) Field of Classification Search
CPC ...... H01R 9/24; H01R 13/514; H05K 7/1469; G05B 19/4185; G05B 2219/31088
USPC ....................................................... 439/175
See application file for complete search history.

(56) References Cited

U.S. PATENT DOCUMENTS

| | | | | |
|---|---|---|---|---|
| 4,454,382 A | * | 6/1984 | Borne | H02B 1/052 439/817 |
| 4,776,815 A | * | 10/1988 | Baillet | H01R 9/2691 439/712 |
| 5,158,464 A | * | 10/1992 | Landrini | H02G 3/16 439/49 |
| 5,775,955 A | * | 7/1998 | Graube | H01R 9/2658 439/716 |
| 6,033,268 A | * | 3/2000 | Piper | H01R 9/22 439/715 |
| 6,175,932 B1 | * | 1/2001 | Foote | G06F 13/409 710/10 |
| 6,371,435 B1 | * | 4/2002 | Landis | H02B 1/052 439/716 |

(Continued)

FOREIGN PATENT DOCUMENTS

EP      2698677 A1    2/2014

OTHER PUBLICATIONS

European Patent Office, Extended European Search Report in European Application No. 21182384.4, 9 pp. (Jan. 3, 2022).

*Primary Examiner* — Alexander Gilman
(74) *Attorney, Agent, or Firm* — Leydig, Voit & Mayer, Ltd.

(57) ABSTRACT

A terminal block unit for an input/output device of a modular process control system includes two slot elements configured to receive two redundant signal conditioning units. The terminal block unit is configured to be housed in a pair of two adjacent slot elements of a module termination unit of an input/output device. The terminal block unit provides a parallel connection of the redundant signal conditioning units to a field device.

16 Claims, 3 Drawing Sheets

(56) References Cited

U.S. PATENT DOCUMENTS

| | | | |
|---|---|---|---|
| 6,390,890 B1 * | 5/2002 | Molnar | B24B 37/245 |
| | | | 451/527 |
| D472,878 S * | 4/2003 | Kitamura | D13/151 |
| 6,802,737 B2 * | 10/2004 | Bergner | H05K 7/1465 |
| | | | 439/716 |
| 6,811,425 B1 * | 11/2004 | Chiang | H01R 9/24 |
| | | | 439/372 |
| 7,281,959 B2 * | 10/2007 | Gerving | H01H 71/02 |
| | | | 439/712 |
| 7,625,250 B2 * | 12/2009 | Blackwell | H05K 7/1425 |
| | | | 439/717 |
| 8,379,398 B2 * | 2/2013 | Correll | H05K 7/14 |
| | | | 361/741 |
| 9,170,277 B2 * | 10/2015 | Tombers | H01R 9/2491 |
| 9,325,110 B2 * | 4/2016 | Lostoski | H01R 9/2408 |
| 9,545,027 B2 * | 1/2017 | Chiang | H01R 25/142 |
| 9,730,353 B2 * | 8/2017 | Bury | H05K 7/1474 |
| 9,966,714 B1 | 5/2018 | Sreedharan | H01R 13/6271 |
| 10,186,821 B2 * | 1/2019 | Müller | H01R 12/732 |
| 10,194,553 B1 | 1/2019 | Chakraborty | H01R 13/6272 |
| 10,305,212 B2 * | 5/2019 | Larsson | H01R 13/5213 |
| 10,579,558 B1 * | 3/2020 | Sundaresh | H01R 43/26 |
| 10,631,426 B1 * | 4/2020 | Lostoski | H05K 7/1417 |
| 10,838,386 B1 * | 11/2020 | Wrobel | G06F 11/1616 |
| 10,986,748 B1 * | 4/2021 | Wrobel | H05K 7/1478 |
| 11,016,921 B2 * | 5/2021 | Reder | G05B 19/12 |
| 11,081,816 B2 * | 8/2021 | Bonnin Pons-Estel | |
| | | | G05B 19/02 |
| 11,587,703 B2 * | 2/2023 | Esposito de la Torella | |
| | | | H05K 9/0066 |
| 11,870,200 B2 * | 1/2024 | Ogawa | H01R 9/2458 |
| 2012/0092826 A1 * | 4/2012 | Heidepriem | H01L 23/4006 |
| | | | 361/679.54 |
| 2012/0102715 A1 * | 5/2012 | Chin | F16B 3/00 |
| | | | 403/345 |
| 2017/0344451 A1 * | 11/2017 | Vanderah | G06F 11/3031 |
| 2019/0140373 A1 * | 5/2019 | Wrobel | H05K 7/1469 |
| 2020/0127411 A1 * | 4/2020 | Pakimo | H01R 12/55 |
| 2020/0342739 A1 * | 10/2020 | Virkler | H01R 13/7036 |
| 2021/0100124 A1 * | 4/2021 | Wrobel | H05K 7/1465 |
| 2022/0416452 A1 * | 12/2022 | Norberg | H01R 9/24 |
| 2024/0172386 A1 * | 5/2024 | Saeki | G06F 1/189 |

* cited by examiner

TERMINAL BLOCK UNIT FOR AN INPUT/OUTPUT DEVICE OF A MODULAR PROCESS CONTROL SYSTEM

CROSS-REFERENCE TO RELATED APPLICATIONS

This patent application claims priority to European Patent Application No. 21182384.4, filed on Jun. 29, 2021, which is incorporated herein in its entirety by reference.

FIELD OF THE DISCLOSURE

The present disclosure relates to a terminal block unit for an input/output device of a modular process control system, an input/output device with such terminal block unit and a modular process control system with such an input/output device.

BACKGROUND OF THE INVENTION

Process control systems are generally known in the prior art. Process control systems comprise several different hardware units, for example, at least one I/O module with several signal conditioning units, a power source, a communication interface unit and a control unit. Process control systems are used among others to control complex production plants, e.g. in process industry or automobile industry. For example, such a system was developed by the applicant under the type designation ABB Ability System 800xA Select I/O.

It has now become apparent that there is a further need to provide I/O channels of an I/O module redundantly in a simple and safe way.

BRIEF SUMMARY OF THE INVENTION

In one aspect, the present disclosure describes providing I/O channels of an I/O module redundantly in a simple and safe way. These and other objects, which become apparent upon reading the following description, are solved by the subject matter of the independent claims. The dependent claims refer to preferred embodiments of the invention.

According to an aspect of the present disclosure, a terminal block unit for an input/output device of a modular process control system is provided, comprising: two slot elements configured to receive two redundant signal conditioning units; wherein the terminal block unit is configured to be housed in a pair of two adjacent slot elements of a module termination unit of an input/output device; wherein the terminal block unit provides a parallel connection of the redundant signal conditioning units to a field device.

Notably, the terminal block unit is preferably configured to be directly housed in a pair of two adjacent slot elements of a module termination unit, i.e. no further contact elements, units, modules, etc. are arranged between the slot elements of the module termination unit and the plug/socket/connector of the terminal block unit.

BRIEF DESCRIPTION OF THE SEVERAL VIEWS OF THE DRAWING(S)

In the following, the present disclosure is described exemplarily with reference to the enclosed figures.

DETAILED DESCRIPTION OF THE INVENTION

Figure 1:
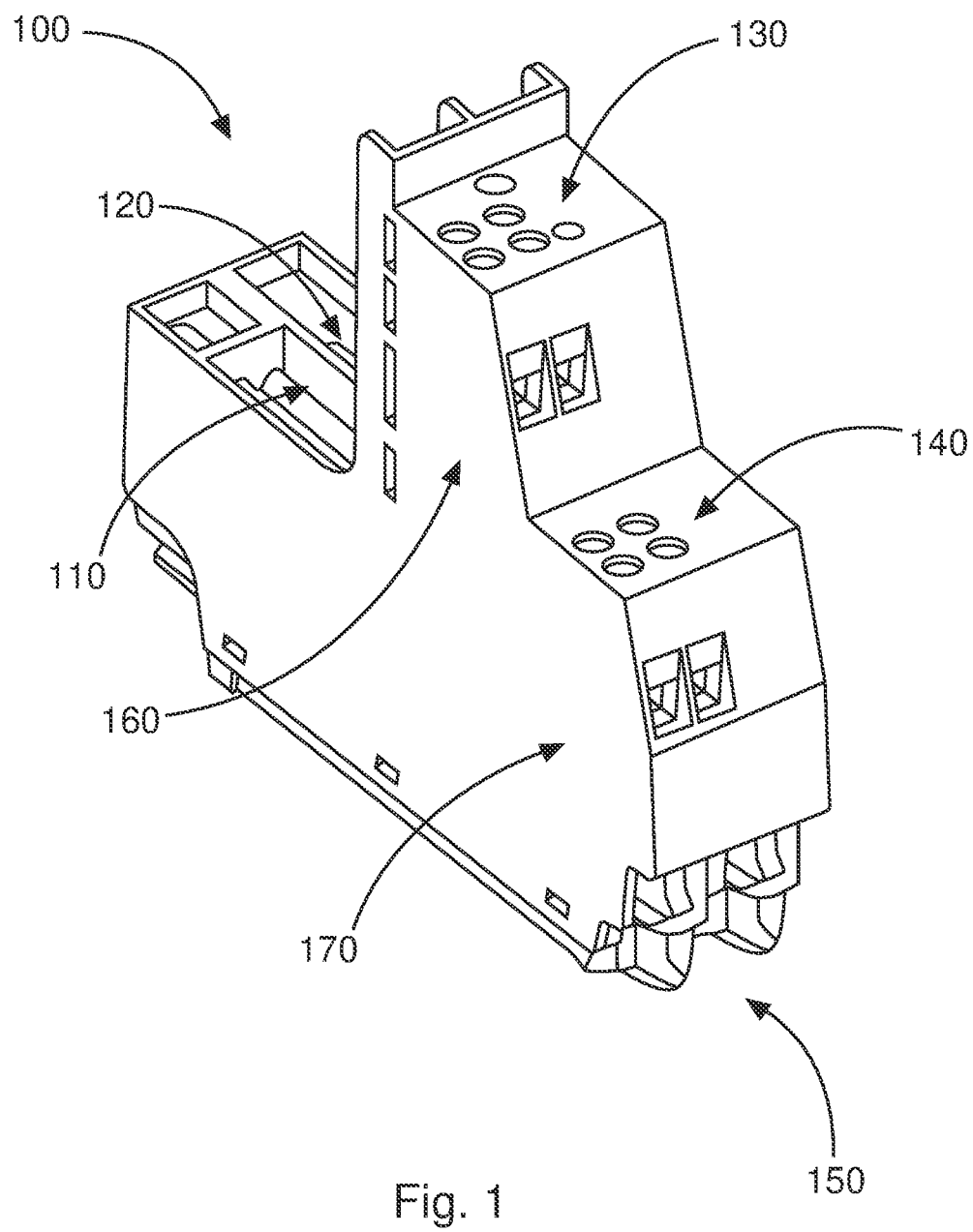
FIG. 1 is a schematic view of a terminal block unit according to an embodiment of the present disclosure.

In FIG. 1, a terminal block unit 100 for an input/output device of a modular process control system is schematically shown. The terminal block unit 100 comprises two input/output slot elements 110 and 120, which are configured to receive two redundant signal conditioning units (cf. FIG. 2). Redundant signal conditioning units may be embodied as signal conditioning units, which are identical or which at least provide the same technical function. The terminal block unit 100 may comprises probe holes 130, 140 for each terminal for connecting test probes for voltage measurements. By means of a contact socked, e.g. U-shape contact element, the terminal block unit 100 can be housed in a pair of two adjacent slot elements of a module termination unit 300 (cf. FIG. 2). Moreover, the terminal block unit 100 may comprise several input clamp or screw contacts 160, 170 for inputs such as for supply voltage, ground connections, and the like. Finally, the terminal block unit 100 may comprise a socket 150 for inserting the terminal block unit in a module termination unit 300.

Figure 2:
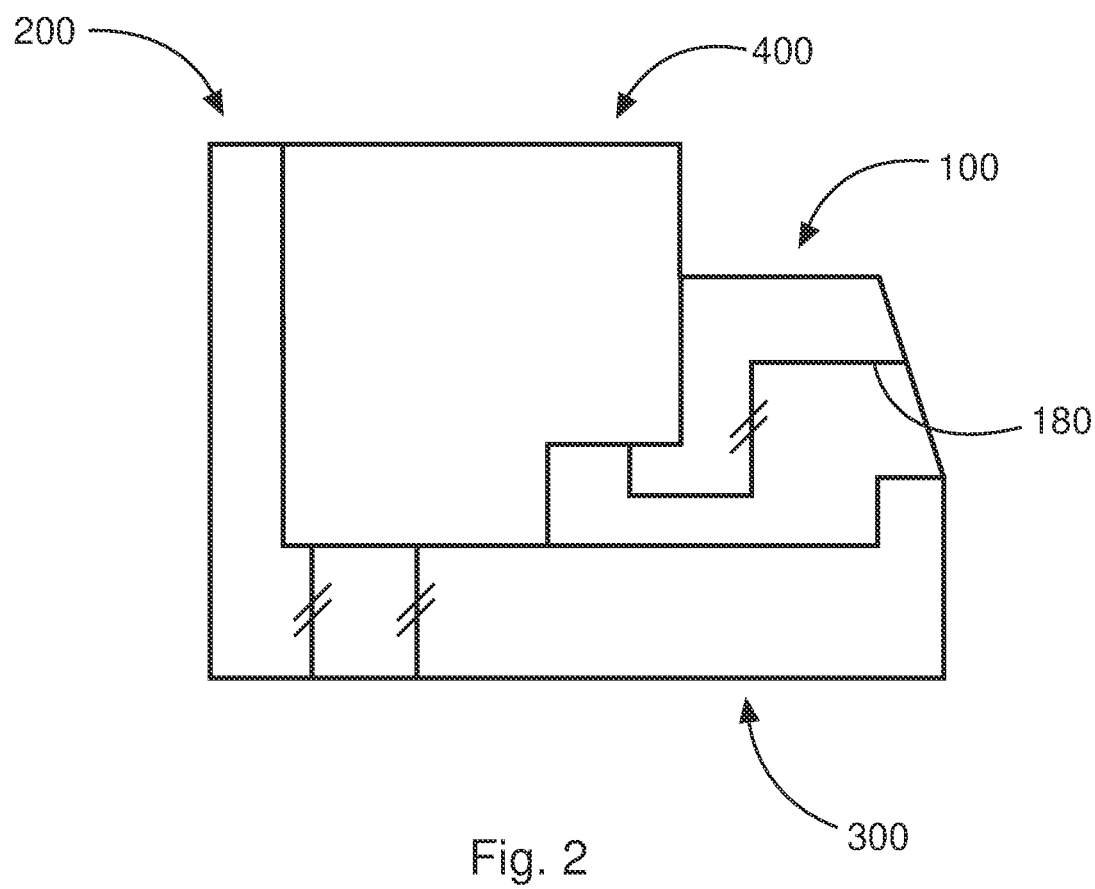
FIG. 2 is a schematic cross sectional view of input/output device according to an embodiment of the present disclosure.

FIG. 2 shows a schematic cross sectional view of an input/output device 200 comprising a module termination unit 300, at least one terminal block unit 100 as shown in FIG. 1, which is housed in the module termination unit 300 and at least two redundant signal conditioning units 400, 410, which are housed in the terminal block unit 100. As shown in FIG. 2, the terminal block unit 100 may also comprise a field connection 180.

Figure 3:
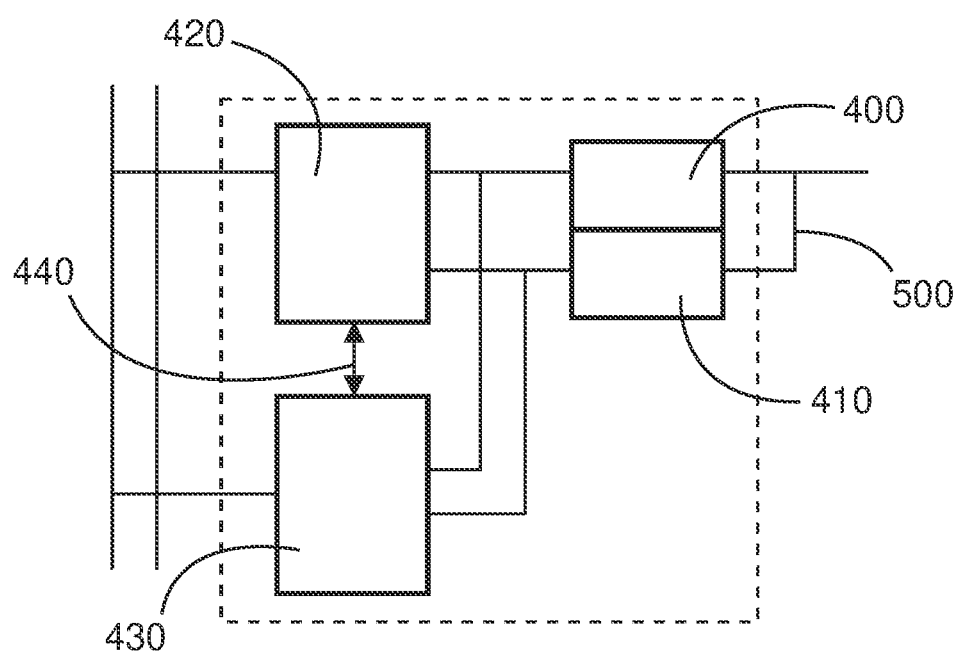
FIG. 3 is a schematic exemplary wiring diagram of redundant signal conditioning units in an input/output device in accordance with the disclosure.

FIG. 3 shows a schematic exemplary wiring diagram of redundant signal conditioning units 400, 410 housed in a terminal block unit 100 in an input/output device 200. As shown, an input of a primary signal conditioning unit 400 and an input of a backup signal conditioning unit 410 are connected in parallel with a process input signal 500 of a field device (not shown). Moreover, also an output of the primary signal conditioning unit 400 and an output of the backup signal conditioning unit 410 are connected in parallel with at least one generic input/output unit, wherein in the shown preferred embodiment, redundant generic input/output units 420, 430 are provided. In the preferred embodiment, the generic input/output units 420, 430 are connected via a communication link 440.

Figure 4:
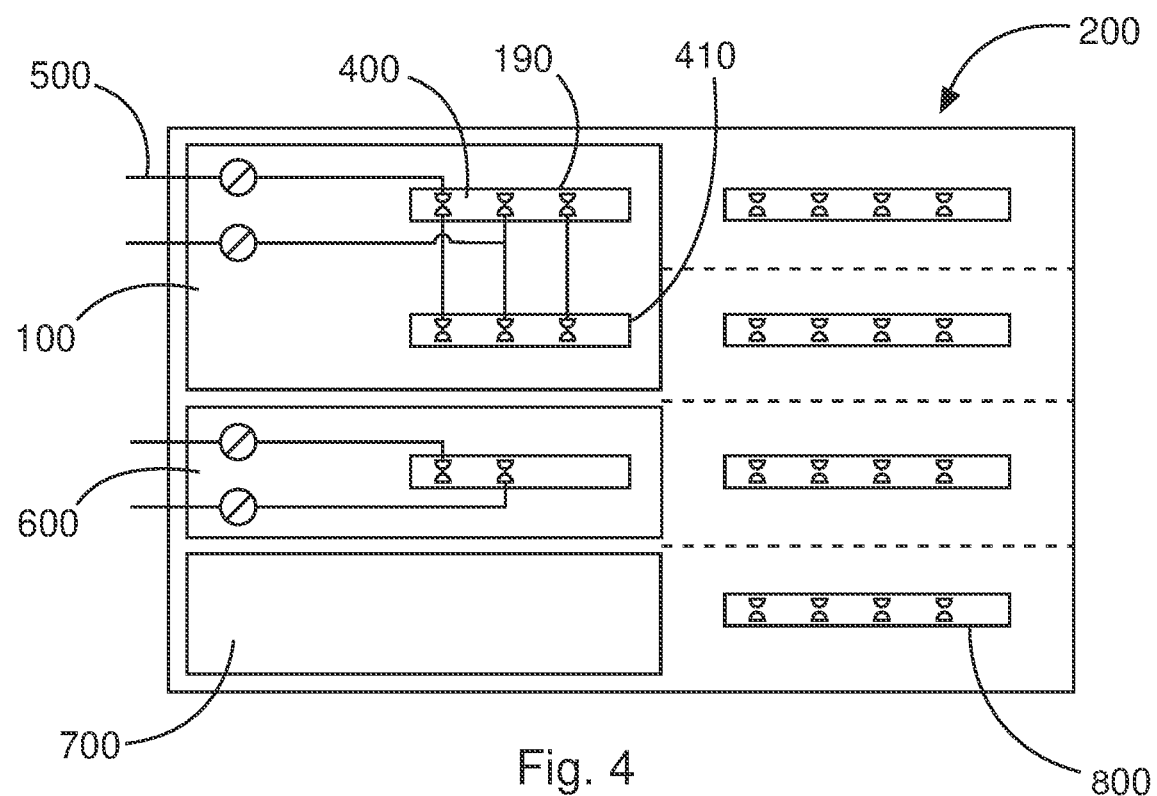
FIG. 4 is a schematic top view of an input/output device with a redundant terminal block unit and a single terminal block unit in accordance with the disclosure.

FIG. 4 shows a schematic top view of an input/output device 200 with a redundant terminal block unit 100 and a single terminal block unit 600, wherein a slot element 700 of the input/output device 200 is not used. As shown, a process input signal 500 of a field device (not shown) can be connected in parallel with a redundant pair of signal conditioning units 400 and 410. The input/output device 200 further comprises connector elements 800 to the system interface. As also shown in FIGS. 4 and 5, the terminal block unit 100 may further comprise a redundancy contact element 190 configured to provide a communication link between the redundant signal conditioning units 400 and 410.

Figure 5:
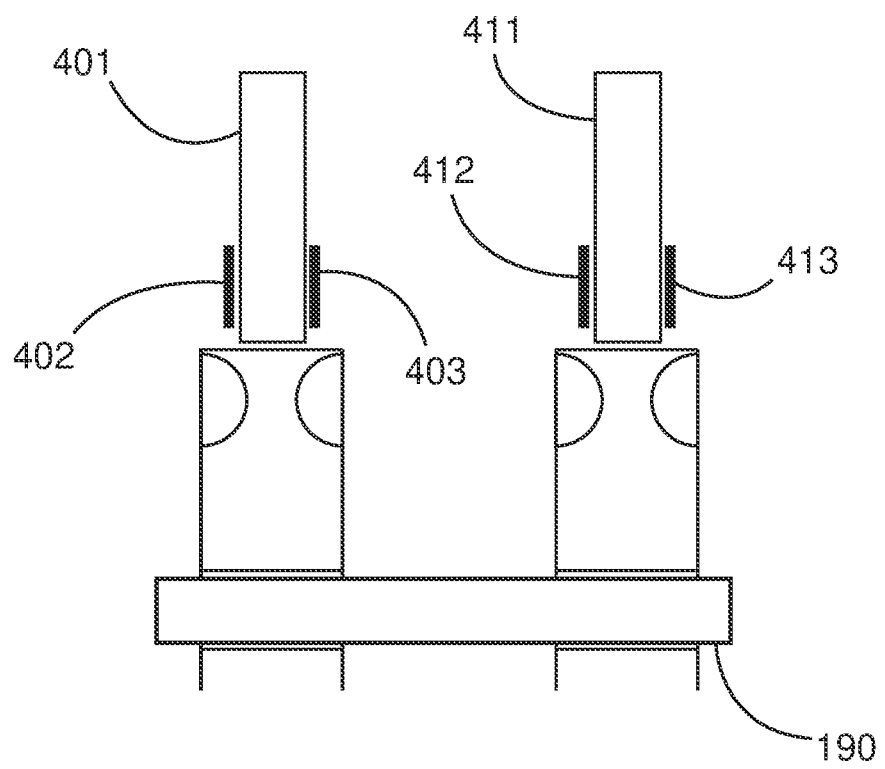
FIG. 5 is a schematic view of a redundancy contact element.

FIG. 5 shows the redundancy contact element 190 and its contacts to the redundant signal conditioning units 400 and 410 in more detail. The PCB 401 of the primary signal conditioning unit 400 with its contact pads 402 and 403 of is shown on the left side, whereas the PCB 411 of the backup signal conditioning unit 410 with its contact pads 412 and 413 is shown on the right side. By means of the redundancy contact element 190 a short circuit of the contact pad 402 to 403 or 412 to 413 allows a signal conditioning unit detection to the redundant terminal block. Moreover, the contact may also be used to provide a communication link for the redundant signal conditioning units. Thus, by means of this double function the number of necessary contact elements in the terminal block unit may be reduces. At the single terminal block unit 600, no such redundancy contact element 190 is provided such that no short circuit between the contact pads 402 and 403 could indicate the single terminal unit configuration.

For configurations where high availability is a requirement, input/output channels shall be configured redundant. By means of the present disclosure, it is possible to configure redundancy on channel granular basis for safety and non-safety signals. Signals for field connections are not routed through a backplane/module termination unit (cf. FIG. 2). This gives several technical and economic benefits. Only those input/output channels that have high requirements on availability need to be configured redundant. Other channels on same baseplate can remain in single configuration to keep high channel density and safe costs. During commissioning this gives high flexibility, it can be decided late in the project schedule whether it needs to be redundant or not. Also after several years of execution, redundancy can be added to existing channels without creating too much effort.

(Field) Terminal Block Unit

As there are no electrical connections between a backplane and the terminal block unit, the terminal block type can be chosen dependent on the requirements of the connected field device (e.g. single/redundant, IS/NonIS, 24V/120V/230V). Terminal blocks units and signal conditioning units that are not allowed to be combined (e.g. Non-IS SCM and IS FTB) may comprise a mechanical lock that prevents its combination. In case where multiple terminal blocks units can be used (e.g. Single/Redundant), the different terminal blocks units may comprise a self-learning function by which the plugged signal conditioning unit may read out. This information may then propagated to the engineering tools to simplify a commissioning. For special signal types, it is also possible to add electronics into the terminal block unit.

Signal Conditioning Unit Redundancy

When two Signal conditioning units are expected to execute as redundant pair they have to be plugged in a redundant terminal block unit, by which they are connected to the field device in parallel. There is no direct communication channel between two redundant signal conditioning units. This reduces complexity and safes cost. Two redundant signal conditioning units may exchange information via the generic input/output unit(s) (cf. FIG. 3). The inputs of the redundant signal conditioning units read the process value in parallel. The outputs of the redundant signal conditioning units drive the output in parallel, wherein in case of analog output signal conditioning units both modules share the current and drive 50% of the total process value each. This architecture makes it possible that both primary and backup redundant signal conditioning unit have always the capability to execute all supervision. This prevents that there are any hidden errors that are first detected after a redundancy switchover. With analog redundant signal conditioning units which are capable to perform HART-Communication, only the primary redundant signal conditioning unit is active, however the backup redundant signal conditioning unit is continuously listening to the communication to make data available immediately after a redundancy switchover. In case the generic input/output unit is configured redundant as well, the backup generic input/output unit cyclically checks its communication link to both redundant signal conditioning units to safeguard availability after a redundancy switchover. Both primary and backup signal conditioning unit may generate alarm and events. This architecture reduces the risk that events are lost in case of a redundancy switchover.

It can decided for each channel whether it shall be redundant or not and the signals to the terminals are not routed through the module terminal unit: Redundant terminal block units for safety and non-safety single channel universal input/output signals. Technical advantage: It can be defined in a very late step of the commissioning, if the channels shall be redundant or not. Flexible way for commissioning the system and easier to do late changes. After several years of runtime of a plant you can easily add redundant channels. One does not need to change the baseplate, but only the terminal block.

The terminal block unit type can be chosen depending what signal type is at hand, e.g. relays. Technical advantage: High voltage and the terminal block unit according to the present disclosure can be used for different signals.

Terminal block unit detection is available, since the signal conditioning unit can detect, if it is mounted in redundant or non-redundant terminal block. Technical advantage: the real configuration can be read out in order to do a much easier engineering of the system.

An implicit information exchange without a direct redundancy link is available. Data exchange in between redundant modules without separate redundancy link, but via the generic input/output unit(s). Technical advantage: Lower hardware costs Backup generic input/output unit may check cyclically the communication link to both redundant signal conditioning units. Technical advantage is to get fast redundancy switchover.

It is possible to actively test the ability to power a field device through temporarily increasing/decreasing the voltage of the backup channel compared to the active channel.

50/50% output value sharing of output modules may provide the technical advantage that the value drops only by 50% in case of red switchover.

Backup signal conditioning unit may listening to HART-Communication of the primary redundant signal conditioning unit provides the technical advantage that HART data is provided immediately after switchover.

Both redundant signal conditioning units may generate events to not lose them during redundancy switchover.

The present disclosure has been described in conjunction with a preferred embodiment as examples as well. However, other variations can be understood and effected by those persons skilled in the art and practicing the claimed invention, from the studies of the drawings, this disclosure and the claims. Notably, in particular, the any steps presented can be performed in any order, i.e. the present invention is not limited to a specific order of these steps. Moreover, it is also not required that the different steps are performed at a certain place or at one node of a distributed system, i.e. each of the steps may be performed at a different nodes using different equipment/data processing units.

In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

In an embodiment of the terminal block unit, the parallel connection is provided by means of a hard wiring and/or by means of an electronic redundancy circuit comprising electronic elements, like elements for voltage, power limiting and common current shunt, or something else as fuse.

In an embodiment of the terminal block unit, the terminal block unit provides no direct communication channel between two redundant signal conditioning units.

In an embodiment of the terminal block unit, the terminal block unit comprises a redundancy contact element configured to provide a communication link between the redundant signal conditioning units. The generic input/output unit handles the communication between a fieldbus communication interface and the signal conditioning units. The generic input/output unit communicates upstream with the fieldbus communication interface using, for example, Modulebus, and downstream with up to various signal conditioning units, e.g. up to 16 signal conditioning units. Such generic input/output units may be used in a single or a redundant mode.

In an embodiment of the terminal block unit, the terminal block unit comprises only two slot elements configured to receive only the two redundant signal conditioning units.

In an embodiment of the terminal block unit, the terminal block unit comprises at least one blocking element configured to prohibit the insertion of certain (e.g. unsupported signal family types) signal conditioning units in the slot elements, e.g. intrinsically safe signal conditioning units, 24V signal conditioning units, high voltage signal conditioning units and/or any other signal type family, wherein the blocking element is preferably arranged at the slot elements.

In an embodiment of the terminal block unit, the terminal block unit comprises coding elements configured to mate with coding elements of a signal conditioning unit for determining the type of signal conditioning unit.

In an embodiment of the terminal block unit, the terminal block unit comprises identification elements configured to provide information to the signal conditioning unit that the terminal block unit is a redundant terminal block unit for receiving two redundant signal conditioning units.

In an embodiment of the terminal block unit, the terminal block unit comprises at least one probe hole for measurement purposes, e.g. for measuring voltage, signals and/or for a communication link with a handheld device for diagnose, setting, upload measurements.

According to a further aspect, an Input/output device comprising at least one module termination unit housing at least one generic input/output unit and at least one terminal block unit as described above is provided.

In an embodiment of the input/output device, the module termination unit comprises between 8 and 32 slot elements, preferably 18 slot elements, housing two generic input/output units and providing 16 further slot elements for single termination blocks each occupying one slot element and/or (redundant) termination blocks as described above each occupying two slot elements of the module termination block.

According to a further aspect, a modular process control system is provided comprising at least one input/output device, wherein at least one terminal block unit as described above is housed in a module termination unit of the input/output device and wherein in the slot elements of the terminal block unit a pair of redundant signal conditioning units is housed.

In an embodiment of the modular process control system, the two redundant signal conditioning units are configured to read or write a process value of a field device in parallel.

In an embodiment of the modular process control system, the signal conditioning units are configured to provide an analog output, wherein both signal conditioning units share the current and drive of the total process value of the field device, wherein both signal conditioning units preferably share the current and drive 50% of the total process value of the field device.

In an embodiment of the modular process control system, the signal conditioning units are configured to provide a digital output, wherein only a primary signal conditioning unit is active and a backup signal conditioning unit is continuously listening to the communication.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A terminal block unit for an input/output device of a modular process control system, comprising:
two slot elements configured to receive two redundant signal conditioning units;
wherein the terminal block unit is configured to be housed in a pair of two adjacent slot elements of a module termination unit of an input/output device;
wherein the terminal block unit provides a parallel connection of the redundant signal conditioning units to a field device.

2. The terminal block unit according to claim 1, wherein the parallel connection for the redundant signal conditioning units is provided through a hard wiring.

3. The terminal block unit according to claim 1, wherein the parallel connection for the redundant signal conditioning units is provided through an electronic redundancy circuit.

4. The terminal block unit according to claim 1, wherein the terminal block unit provides no direct communication channel between two redundant signal conditioning units.

5. The terminal block unit according to claim 1, wherein the terminal block unit comprises a redundancy contact element configured to provide a communication link between the redundant signal conditioning units.

6. The terminal block unit according to claim 1, wherein the terminal block unit comprises only two slot elements configured to receive only the two redundant signal conditioning units.

7. The terminal block unit according to claim 1, wherein the terminal block unit comprises at least one blocking element configured to prohibit the insertion of certain signal conditioning units in the slot elements, the certain signal conditioning units including unsupported signal family types, intrinsically safe signal conditioning units, high voltage signal conditioning units and/or 24V signal conditioning units, and wherein the blocking element is preferably arranged at the slot elements.

8. The terminal block unit according to claim 1, wherein the terminal block unit comprises coding elements configured to mate with coding elements of a signal conditioning unit for determining a type of signal conditioning unit.

9. The terminal block unit according to claim 1, wherein the terminal block unit comprises identification elements configured to provide the information to provide information to the signal conditioning unit that the terminal block unit is a terminal block unit for receiving two redundant signal conditioning units.

10. The terminal block unit according to claim 1, wherein the terminal block unit comprises at least one probe hole, the probe hole configured to provide access to insertion of measurement probes, the measurement probes carrying out voltage measurements, signal measurements, and/or the probe hole being configured to provide a communication link with a handheld device for diagnose, setting and/or upload purposes.

11. An Input/output device comprising:
at least one module termination unit housing;
at least one generic input/output unit; and
at least one terminal block unit, the at least one terminal block unit comprising two slot elements configured to receive two redundant signal conditioning units;
wherein the terminal block unit is configured to be housed in a pair of two adjacent slot elements of a module termination unit of an input/output device;
wherein the terminal block unit provides a parallel connection of the redundant signal conditioning units to a field device.

12. The input/output device according to claim 11, wherein the module termination unit comprises between 8 and 32 slot elements, houses an additional generic input/output unit, and includes single termination blocks and/or termination blocks.

13. A modular process control system comprising at least one input/output device, wherein at least one terminal block unit is housed in a module termination unit of an input/output device, and wherein a pair of redundant signal conditioning units is housed in slot elements of a terminal block unit;
wherein the terminal block unit comprises two slot elements configured to receive two redundant signal conditioning units;
wherein the terminal block unit is configured to be housed in a pair of two adjacent slot elements of a module termination unit of an input/output device; and
wherein the terminal block unit provides a parallel connection of the redundant signal conditioning units to a field device.

14. The modular process control system according to claim 13, wherein the two redundant signal conditioning units are configured to read a process value of a field device in parallel.

15. The module process control system according to claim 13, wherein the signal conditioning units are configured to provide an analog output, wherein both signal conditioning units share the current and drive the total process value of the field device, wherein both signal conditioning units share the current and drive 50% of the total process value of the field device.

16. The module process control system according to claim 13, wherein the signal conditioning units are configured to provide a digital output, wherein only a primary signal conditioning unit is active and a backup signal conditioning unit is continuously listening to the communication.

* * * * *